(12) United States Patent
Chen et al.

(10) Patent No.: US 6,537,905 B1
(45) Date of Patent: Mar. 25, 2003

(54) FULLY PLANARIZED DUAL DAMASCENE METALLIZATION USING COPPER LINE INTERCONNECT AND SELECTIVE CVD ALUMINUM PLUG

(75) Inventors: Liang-Yuh Chen, San Jose, CA (US); Ted Guo, Palo Alto, CA (US); Roderick Craig Mosley, Pleasanton, CA (US); Fusen Chen, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/778,205

(22) Filed: Dec. 30, 1996

(51) Int. Cl.⁷ .................. H01L 21/4763; H01L 21/44
(52) U.S. Cl. .................. 438/629; 438/638; 438/639; 438/672
(58) Field of Search .................. 438/622, 627, 438/628, 629, 623, 624, 625, 626, 637, 638, 666, 667, 668, 672, 639

(56) References Cited

U.S. PATENT DOCUMENTS

| 4,920,072 A | 4/1990 | Keller et al. |
|---|---|---|
| 4,920,073 A | 4/1990 | Wei et al. |
| 4,985,750 A | 1/1991 | Hoshino |
| 4,994,410 A | 2/1991 | Sun et al. |

(List continued on next page.)

FOREIGN PATENT DOCUMENTS

| DE | 3743591 A1 | 7/1988 | |
|---|---|---|---|
| EP | 0435388 A2 | 12/1989 | |
| EP | 0435388 A3 | 7/1991 | |
| EP | 0558004 A3 | 9/1993 | |
| EP | 0558004 A2 | 9/1993 | |
| EP | 0 747 947 A2 | 12/1996 | ......... H01L/21/768 |
| JP | 63-9925 | 11/1994 | |
| JP | 2513900 | 7/1996 | |
| WO | WO 96/12297 | 4/1996 | ......... H01L/21/768 |

OTHER PUBLICATIONS

Wolf, S. Silicon Processing for the VLSI Era, vol. 2, Lattice Press, p. 240, 1990.*

(List continued on next page.)

*Primary Examiner*—David E. Graybill
(74) *Attorney, Agent, or Firm*—Moser, Patterson & Sheridan LLP

(57) ABSTRACT

The present invention generally provides a metallization process for forming a highly integrated interconnect. More particularly, the present invention provides a dual damascene interconnect module that incorporates selective chemical vapor deposition aluminum (CVD Al) via fill with a metal wire, preferably copper, formed within a barrier layer. The invention provides the advantages of having copper wires with lower resistivity (greater conductivity) and greater electromigration resistance than aluminum, a barrier layer between the copper wire and the surrounding dielectric material, void-free, sub-half micron selective CVD Al via plugs, and a reduced number of process steps to achieve such integration.

25 Claims, 3 Drawing Sheets

U.S. PATENT DOCUMENTS

| | | | |
|---|---|---|---|
| 5,010,032 A | | 4/1991 | Tang et al. |
| 5,081,064 A | | 1/1992 | Inoue et al. |
| 5,091,339 A | | 2/1992 | Carey |
| 5,147,819 A | | 9/1992 | Yu et al. |
| 5,250,465 A | | 10/1993 | Iizuka et al. |
| 5,292,558 A | | 3/1994 | Heller et al. |
| 5,354,712 A | * | 10/1994 | Ho et al. |
| 5,384,284 A | | 1/1995 | Doan et al. |
| 5,439,731 A | | 8/1995 | Li et al. |
| 5,462,890 A | * | 10/1995 | Hwang et al. |
| 5,480,836 A | | 1/1996 | Harada et al. |
| 5,514,425 A | | 5/1996 | Ito et al. |
| 5,529,953 A | | 6/1996 | Shoda ............ 437/189 |
| 5,578,523 A | * | 11/1996 | Fiordalice et al. ........ 438/633 |
| 5,585,673 A | | 12/1996 | Joshi et al. |
| 5,633,199 A | * | 5/1997 | Fiordalice et al. ........ 438/642 |
| 5,783,485 A | * | 7/1998 | Ong et al. |
| 5,877,087 A | * | 3/1999 | Mosely et al. ........ 438/646 |
| 5,897,369 A | * | 4/1999 | Jun |
| 5,989,633 A | * | 11/1999 | Hoinkis ............ 204/192.1 |
| 6,066,358 A | * | 5/2000 | Guo et al. ............ 204/192.1 |
| 6,077,781 A | * | 6/2000 | Guo et al. ............ 438/639 |
| 6,120,844 A | * | 9/2000 | Chen et al. ............ 204/192.1 |
| 6,217,721 B1 | * | 4/2001 | Xu et al. ............ 204/192.15 |
| 6,333,265 B1 | * | 12/2001 | Dixit et al. ............ 438/637 |
| 6,355,560 B1 | * | 3/2002 | Mosely et al. ............ 438/643 |

OTHER PUBLICATIONS

Tsubouchi, K., et al., "Complete planarization of via holes with aluminum by selective and nonselective chemical vapor deposition," Applied Physics Letters, vol. 57, No. 12, 1990, pp. 1221–1223.

European Search Report dated Sep. 8, 1999.

Search Report dated May 18, 1999.

K. Mikagi, H. Ishikawa, T. Usami, M. Suzuki, K. Inoue, N. Oda, S. Chikaki, I. Sakai and T. Kikkawa, "Barrier Metal Free Copper Damascene Interconnection Technology Using Atmospheric Copper Reflow and Nitrogen Doping in SiOF Film," 1996 IEEE, pp. 365–368.

Electromigration Failure Distributions for Multi–Large Interconnects as a Function of Line Width: Experiments and Simulation, D.D. Brown, J.E. Sanchez, Jr., V. Pham, P.R. Besser, M.A. Korhonen, and C.–Y. Li, Mat. Res. Soc. Symp. vol. 427.

* cited by examiner

FULLY PLANARIZED DUAL DAMASCENE METALLIZATION USING COPPER LINE INTERCONNECT AND SELECTIVE CVD ALUMINUM PLUG

BACKGROUND OF THE INVENTION

1. Field of the Invention

The present invention relates to a metallization method for manufacturing semiconductor devices. More particularly, the present invention relates to fully planarized dual damascene metallization using a copper line interconnect and a selective CVD metal via plug.

2. Background of the Related Art

Sub-half micron multilevel metallization is one of the key technologies for the next generation of very large scale integration (VLSI). The multilevel interconnects that lie at the heart of this technology require planarization of interconnect features formed in high aspect ratio apertures, including contacts, vias, lines or other features. Reliable formation of these interconnect features is very important to the success of VLSI and to the continued effort to increase circuit density and quality on individual substrates and die.

As circuit densities increase, the widths of vias, contacts and other features, as well as the dielectric materials between them, must decrease. Therefore, there is a great amount of ongoing effort being directed at the formation of smaller and smaller void-free features. One such method involves selective chemical vapor deposition (CVD) of material only on exposed nucleation surfaces as provided on the substrate surface. Selective CVD involves the deposition of a film layer upon contact of a component of the chemical vapor with a conductive substrate. The component nucleates on such substrate creating a metal surface on which further deposition proceeds.

Selective CVD metal deposition is based on the fact that the decomposition of a CVD metal precursor gas usually requires a source of electrons from a conductive nucleation film. In accordance with a conventional selective CVD metal deposition process, the metal should grow in the bottom of an aperture where either a metal film or doped silicon or metal silicide from the underlying conductive layer has been exposed, but should not grow on dielectric surfaces such as the field and aperture walls. The underlying metal films or doped silicon are electrically conductive, unlike the dielectric field and aperture walls, and supply the electrons needed for decomposition of the metal precursor gas and the resulting deposition of the metal. The result obtained through selective deposition is an epitaxial "bottom-up" growth of CVD metal in the apertures capable of filling very small dimension (<0.25 $\mu$m), high aspect ratio (>5:1) via or contact openings.

Elemental aluminum (Al) and its alloys have been the traditional metals used to form lines and plugs in semiconductor processing because of aluminum's low resistivity, superior adhesion to silicon dioxide ($SiO_2$), ease of patterning, and high purity. Furthermore, aluminum precursor gases are available which facilitate the selective CVD process described above. However, aluminum has higher resistivity and problems with electromigration. Electromigration is a phenomenon that occurs in a metal circuit while the circuit is in operation, as opposed to a failure occurring during fabrication. Electromigration is caused by the diffusion of the metal in the electric field set up in the circuit. The metal gets transported from one end to the other after hours of operation and eventually separates completely, causing an opening in the circuit. This problem is sometimes overcome by Cu doping and texture improvement. However, electromigration is a problem that gets worse as the level of integration increases.

Copper and its alloys, on the other hand, have even lower resistivities than aluminum and significantly higher electromigration resistance. These characteristics are important for supporting the higher current densities experienced at high levels of integration and increased device speed. However, the primary problems with integrating copper metal into multilevel metallization systems are (1) the difficulty of patterning the metal using etching techniques, and (2) filling small vias using PVD and lack of CVD process. For devices of submicron minimum feature size, wet etch techniques for copper patterning have not been acceptable due to liquid surface tension, isotropic etch profile, and difficulty in over-etch control. No reliable dry etch process is available.

Several methods have been proposed for producing patterned copper interconnects, including selective electroless plating, selective chemical vapor deposition, high temperature reactive ion etching and lift off processing. Electroless plating requires that the floor of an interconnect be seeded to make the floor conductive. The conductive floor can then be charged to attract copper from a solution or bath.

Selective chemical vapor deposition typically involves the decomposition of a metal precursor gas on an electrically conducting surface. However, a reliable process for selective CVD copper is not available.

High temperature reactive ion etching (RIE), or sputter etching, has also been used to pattern a copper layer. Furthermore, the RIE can be used in conjunction with lift off processing in which excess metal is lifted off the structure by a release layer to leave a planar surface having a copper feature formed therein.

Yet another technique for metal wiring of copper comprises the patterning and etching of a trench via and/or contact within a thick layer of insulating material, such as $SiO_2$. Thereafter, a thin layer of a barrier metal, such as Ti, TiW or TiN, may be provided on top of the insulating layer and within the trough and/or contact to act as a diffusion barrier to prevent inter-diffusion of subsequently deposited metal the metal into the silicon, and between such metal and the oxide forming the contact or trench. After barrier metal deposition, a layer of copper is deposited to completely fill the trench or contact.

Despite the availability of these techniques, there remains a need for a copper metallization process for fabricating interconnects at high levels of integration. Such highly integrated interconnects must provide void-free vias, particularly in high aspect ratio, sub-quarter micron wide apertures for forming lines contacts and vias. Furthermore, there is a need for a process providing a circuit with higher electrical conductivity and improved electromigration resistance. It would be desirable to have a simple process requiring fewer processing steps to form metal plugs in the vias and wires in the trenches. It would be further desirable if the process could achieve all this without the use of metal etch techniques.

SUMMARY OF THE INVENTION

The present invention provides a method for forming a dual damascene interconnect in a dielectric layer having dual damascene via and wire definitions, wherein the via has a floor exposing a deposition enhancing material. The method includes selective chemical vapor deposition of a conductive metal, preferably aluminum, on the deposition enhancing material of the via floor to form a plug in the via. A barrier layer is then deposited over the exposed surfaces of the plug and wire definition. The wire definition is then filled by depositing a conductive metal, preferably copper, over the barrier layer. Finally, the conductive metal, the barrier and the dielectric layers are planarized, such as by chemical mechanical polishing, to define a conductive wire.

Another aspect of the invention provides a method of forming a dual damascene interconnect module over a deposition enhancing material. This method further includes the steps of forming a dielectric layer over the deposition enhancing material and then etching the dielectric layer to form a dual damascene via and wire definition, wherein the via has a floor exposing a deposition enhancing material. Where a substrate does not already have a layer of a deposition enhancing material, this layer may be provided prior to forming the dielectric layer. Furthermore, a multi-level metal interconnect may be formed in accordance with the invention by depositing a subsequent barrier layer of a deposition enhancing material over the planarized layers. A dielectric layer is subsequently formed and filled by repeating the steps described above.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF A PREFERRED EMBODIMENT

Figure 1A:
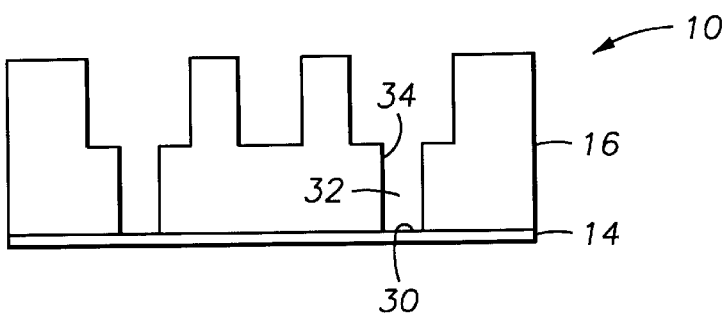
FIGS. 1A through 1E show a dual damascene via and wire definition and steps for providing a metal interconnect in accordance with a first embodiment of the present invention.

The present invention generally provides an in-situ metallization process providing an interconnect in a highly integrated structure which has a reduced interconnect resistance and improved electromigration performance. More particularly, the present invention provides a dual damascene interconnect that incorporates selective chemical vapor deposition (CVD) metal fill of the via with a copper wire formed on a barrier layer. The present invention provides the advantages of having (1) copper wires with lower resistivity (greater conductivity) and greater electromigration resistance than aluminum, (2) a barrier layer between the copper wire and the surrounding dielectric material, (3) void-free, sub-half micron selective CVD metal via plugs, and (4) a reduced number of process steps.

For clarity, the present invention will be described below with reference to a selective CVD Al process for forming via plugs and a PVD Cu process for forming wires. However, other selective CVD metal processes and other PVD metal processes, such as PVD Al/Cu, may be used to accomplish the advantages of the present invention.

In one aspect of the invention, a method is provided for forming dual damascene interconnects having lower resistivity and greater electromigration resistance. The method utilizes a dual damascene via and wire definition etched into a dielectric layer. A sub-half micron via is filled without voids by selective CVD Al. The wire definitions are then given a barrier layer and filled with copper (Cu) using physical vapor deposition (PVD) techniques. The wires are completed by planarizing the structure.

In another aspect of the invention, a method is provided as described above with the additional step of depositing a PVD Al layer over the CVD Al plug and the exposed dielectric layers prior to forming the barrier layer. The PVD Al layer is deposited at a temperature greater than about 150° C. and preferably greater than about 250° C. PVD Al is desirable to provide a planarized metal film where a loss of selectivity in the CVD Al step creates nodules on the dielectric surface. These nodules are incorporated into a thin planarized metal layer to assure that the subsequently deposited barrier layer will be uniformly deposited with no void or gaps through which the copper can diffuse.

To form an IC structure in accordance with the present invention, a dielectric layer is formed by conventional techniques over a deposition enhancing material formed on a substrate. The dielectric layer may be as thick as about twice the thickness of a single metallization layer since a dual damascene via and wire definition will be etched therethrough. Any dielectric material, whether presently known or yet to be discovered, may be used and is within the scope of the present invention. The dielectric layer may be deposited on any suitable deposition enhancing material, but the preferred deposition enhancing materials include conductive metals and doped silicon.

Referring to FIGS. 1A through 1E, a cross-sectional diagram of a layered structure 10 is shown including a dielectric layer 16 formed over a deposition enhancing layer 14, preferably an electrically conducting member or layer. The deposition enhancing layer 14 may take the form of a doped silicon substrate or it may be a first or subsequent conducting layer formed on a substrate. The dielectric layer 16 is formed over the deposition enhancing layer 14 in accordance with procedures known in the art to form a part of the overall integrated circuit.

Once deposited, the dielectric layer is etched to form a dual damascene via and wire, wherein the via has a floor 30 exposing a small portion of the deposition enhancing material 14. Etching of the dielectric layer 16 may be accomplished with any dielectric etching process, including plasma etching. Specific techniques for etching silicon dioxide and organic materials may include such compounds as buffered hydrofluoric acid and acetone or EKC, respectively. However, patterning may be accomplished using any method known in the art.

Referring to FIG. 1A, a cross-sectional diagram of a dual damascene via and wire definition 32 formed in the dielectric layer 16 is shown. The definition 32, formed according to the present invention, is generally intended to facilitate the deposition of a conductive interconnect that will provide an electrical connection with an underlying conductive member. The definition 32 provides via walls 34 and a floor 30 exposing at least a portion of the deposition enhancing material 14. The deposition enhancing material 14 may be a layer, wire or device comprising a metal, doped silicon or other conductive material. In particular, the deposition enhancing material may be provided by a barrier layer of a metal selected from the group consisting of aluminum, aluminum oxides, titanium, titanium nitride, tantalum, tantalum nitride and doped silicon. The presence of a conductive via floor is exploited according to the present invention to provide a selective CVD metal process to fill the via or plug. The preferred metal for selective CVD processing is aluminum. For example, a CVD Al film can be formed by the decomposition reaction of dimethyl aluminum hydride ("DMAH"). This particular reaction occurs much more rapidly when the reactants come in contact with a deposition enhancing material that is an electron donor, such as the surface of an electrically conductive material. Therefore, it is possible to achieve a certain measure of control or selectivity over where and how the CVD Al is deposited by preparing a structure with some surfaces that are conductive and some surfaces that are non-conductive.

Figure 1B:
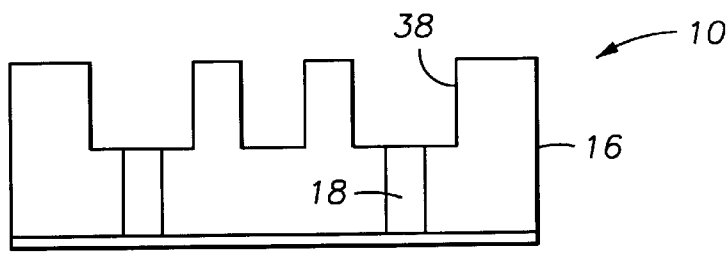

Referring to FIG. 1B, a cross-sectional view of a void-free metal plug 18 formed in the via 32 is shown. Selective CVD Al provides epitaxial growth of a void-free, single crystal plug. Despite the relative selectivity of the CVD Al, small amounts of the CVD Al can also deposit on the surfaces of the non-conductive dielectric layer 16 to form nodules if the surface includes defects that can serve as nucleation sites.

While the CVD Al may be deposited under various conditions, a typical process involves substrate temperatures of between about 120° C. and about 280° C. and a deposition rate of between about 20 Å/sec and about 200 Å/sec,. and between about 300 Å/sec. and about 1000 Å/sec. for selective CVD. The CVD Al deposition may be performed at chamber pressures of between about 1 torr and about 80 torr, with the preferred chamber pressure being about 25 torr. The preferred deposition reaction for CVD Al involves the reaction of dimethyl aluminum hydride ("DMAH") with hydrogen gas ($H_2$) according to the following equation:

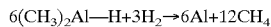

or

The deposition within the via 32 to form a metal interconnect 18 is selective because the surface 30 of the underlying conductive layer 14 has been exposed to the CVD Al at the floor of the via 32. Therefore, the CVD Al is deposited from the floor 30 upward to fill the aperture 32 without any substantial CVD Al deposition on the via walls 34 or intermediate gaps 38a.

Furthermore, the via 32 comprises substantially non-conductive dielectric walls 34 and the conductive floor 30. As discussed above, substantially non-conducting materials, such as the dielectric walls 34 of the aperture, are not good electron donors and, therefore, do not provide good nucleation for decomposition of the CVD metal precursor. Rather, the CVD metal film begins to form on the via floor 30 because the exposed conducting member 14 forming the floor of the via 32 nucleates the decomposition. After an initial layer of the metal has been deposited on the via floor 30, subsequent deposition occurs more easily so that the metal grows from the via floor 30 upward or outward to fill the via 32.

Although defects on the dielectric wall 34 of the via 32 may cause the formation of scattered nodules within the aperture, these nodules typically do not block the aperture to cause voids therein because nodule formation occurs at a much slower rate than selective growth. The via is filled with metal from the floor upward before a nodule has an opportunity to grow across the via and form a void therein, even in a via having an aspect ratio as high as 5:1, because the conducting via floor 30 exposes a much larger surface area than typical defects. The endpoint of the selective deposition is determined by the deposition rate and duration.

Figure 1C:
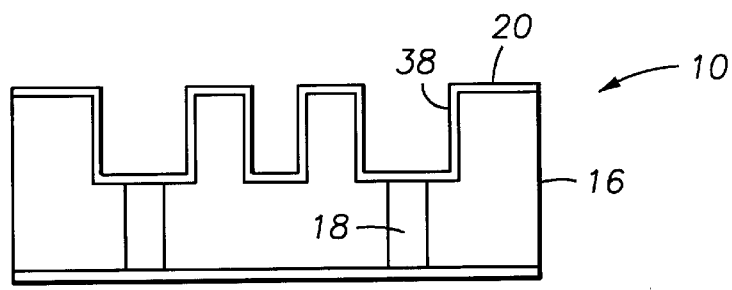

Referring to FIG. 1C, a barrier layer 20 is deposited over the aluminum plug 18 as well as the walls and floor of the wire definition 38. The barrier layer is preferably formed of titanium, titanium nitride, tantalum or tantalum nitride. The barrier layer limits the diffusion of copper and dramatically increases the reliability of the aluminum plug 18. It is preferred that the barrier layer having a thickness between about 50 and about 400 Angstroms (Å), most preferably about 200 Å. However, because the barrier layer is conductive it forms a conductive bridge 37 where a plug 18 is encountered.

The process used to deposit the barrier layers may be PVD or CVD according to known methods. In general, PVD involves sputtering a target comprising the material of the desired barrier layer. The sputtering is induced by striking a plasma adjacent to the target and bombarding the target with plasma species. CVD generally involves the delivery of chemical precursors onto the substrate. The precursors contain the components of the barrier layer material which is deposited by various known processes and conditions according to the material. Some CVD deposition processes of barrier layers are improved by the use of a plasma to lower the reaction temperature.

Figure 1D:
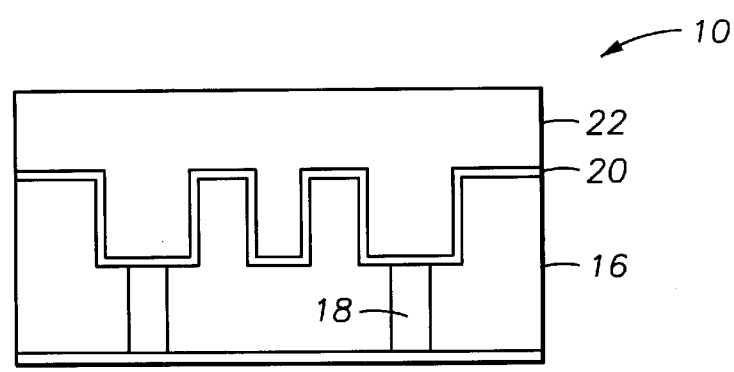

Referring to FIG. 1D, copper 22 is physical vapor deposited over the barrier layer 20 to fill the wire definition 38 (see FIG. 1C). In order to fill the wire definition, it will generally occur that the entire field of the structure will become covered with the PVD Cu.

Figure 1E:
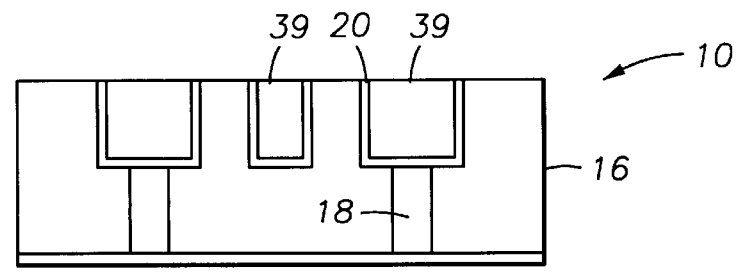

Referring to FIG. 1E, the top portion of the structure 10 is then planarized, preferably by chemical mechanical polishing (CMP). During the planarization process, portions of the copper 22, barrier material 20 and dielectric 16 are removed from the top of the structure leaving a fully planar surface with a conductive wire 39 formed therein and isolating wires formed in the wire definition 38 from one another.

In accordance with a second aspect of the invention, the method described above may further comprise the step of physical vapor depositing a thin layer of aluminum over the exposed surfaces of the plug and wire definition prior to forming the barrier layer. The purpose of the thin PVD Al layer is to smooth over any nodules formed on the surfaces of the wire definition so that the barrier layer will be uniform and continuous.

Figure 2A:
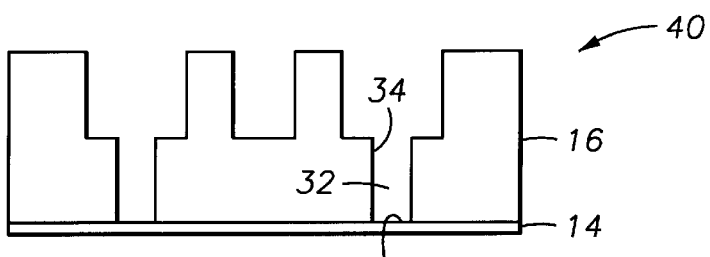
FIGS. 2A through 2F show a dual damascene via and wire definition and steps for providing a metal interconnect in accordance with a second embodiment of the present invention.
Figure 2B:
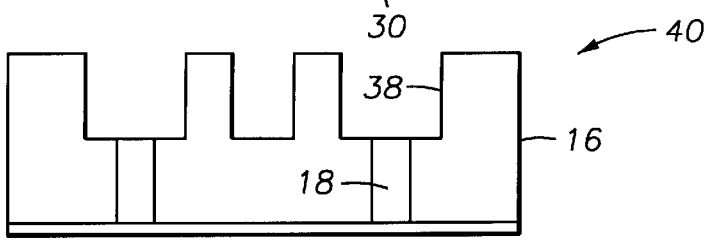
Figure 2C:
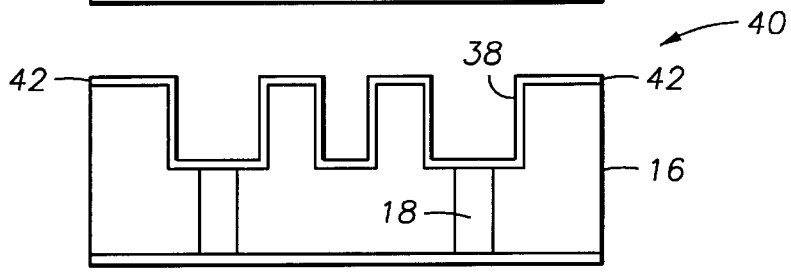
Figure 2D:
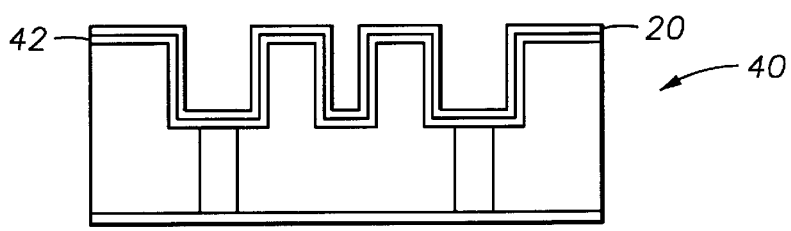
Figure 2E:
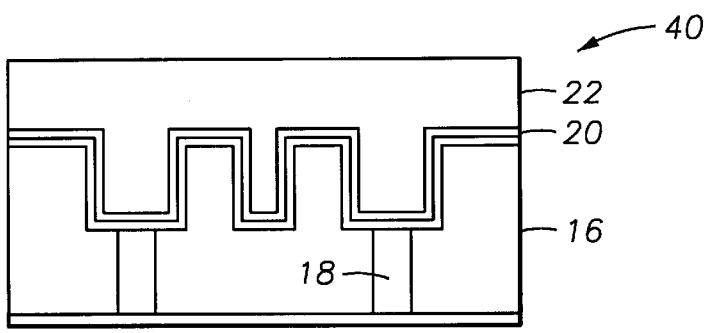
Figure 2F:
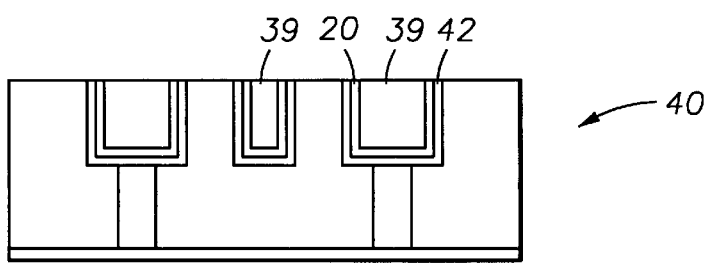

Referring to FIGS. 2A through 2F, the steps involved in this second aspect of the invention are set out. FIGS. 2A and 2B are the same as FIGS. 1A and 1B, respectively. FIG. 2C shows the PVD Al layer 42 formed over the structure 40 from FIG. 2B. The PVD Al provides a smooth layer that incorporates any nodules formed during the previous step of selective CVD Al. The preferred thickness for the PVD Al layer 42 is between about 100 Å and about 700 Å. FIGS. 2D through 2F then detail the deposition of a barrier layer 20, deposition of a PVD Cu layer 22, and planarization of the structure 40 in a similar fashion as set out above in FIGS. 1C through 1E, respectively. Therefore, the second aspect of the invention is vastly similar to the process first described, but with the addition of an intermediate step of depositing a PVD Al layer 42 between the CVD Al plug 18 and the barrier layer 20.

In yet another aspect of the present invention, a method of forming a multilevel metal interconnect is provided. First, a layer of a deposition enhancing material, such as a conducting metal or doped silicon is, provided on a workpiece. A dielectric layer is then formed over the exposed layer of deposition enhancing material and etched to form a dual damascene via and wire definition, wherein the via has a floor exposing the deposition enhancing material. The dielectric layer may be deposited according to any procedures known in the art. Selective chemical vapor deposition of aluminum (CVD Al) is performed to deposit aluminum on the deposition enhancing material of the via floor to form a plug in the via. At this stage, the interconnect may optionally receive a thin layer of PVD Al over the exposed surfaces of the plug and wire definition. This optional layer is helpful to smooth over aluminum nodules on dielectric surfaces caused by loss of selectivity, as described above.

Next, a first barrier layer is deposited over the aluminum plug and dielectric surfaces or, alternatively, over the optional PVD Al layer. PVD Cu is then deposited over the barrier layer to fill the wire definition. The copper, barrier, aluminum and dielectric layers that comprise the structure are planarized, preferably by CMP, to define a conductive wire. A second barrier layer, that can also function as a deposition enhancing material, is then deposited over the planarized layers. In this manner, the copper wire is enclosed by barrier layers to prevent diffusion of the copper and the a deposition enhancing layer is provided so that the process can be repeated any number of times to form a multilevel module. When the last barrier layer has been deposited over the last copper wire, it is preferred that a passivating layer be applied thereover.

Figure 3:
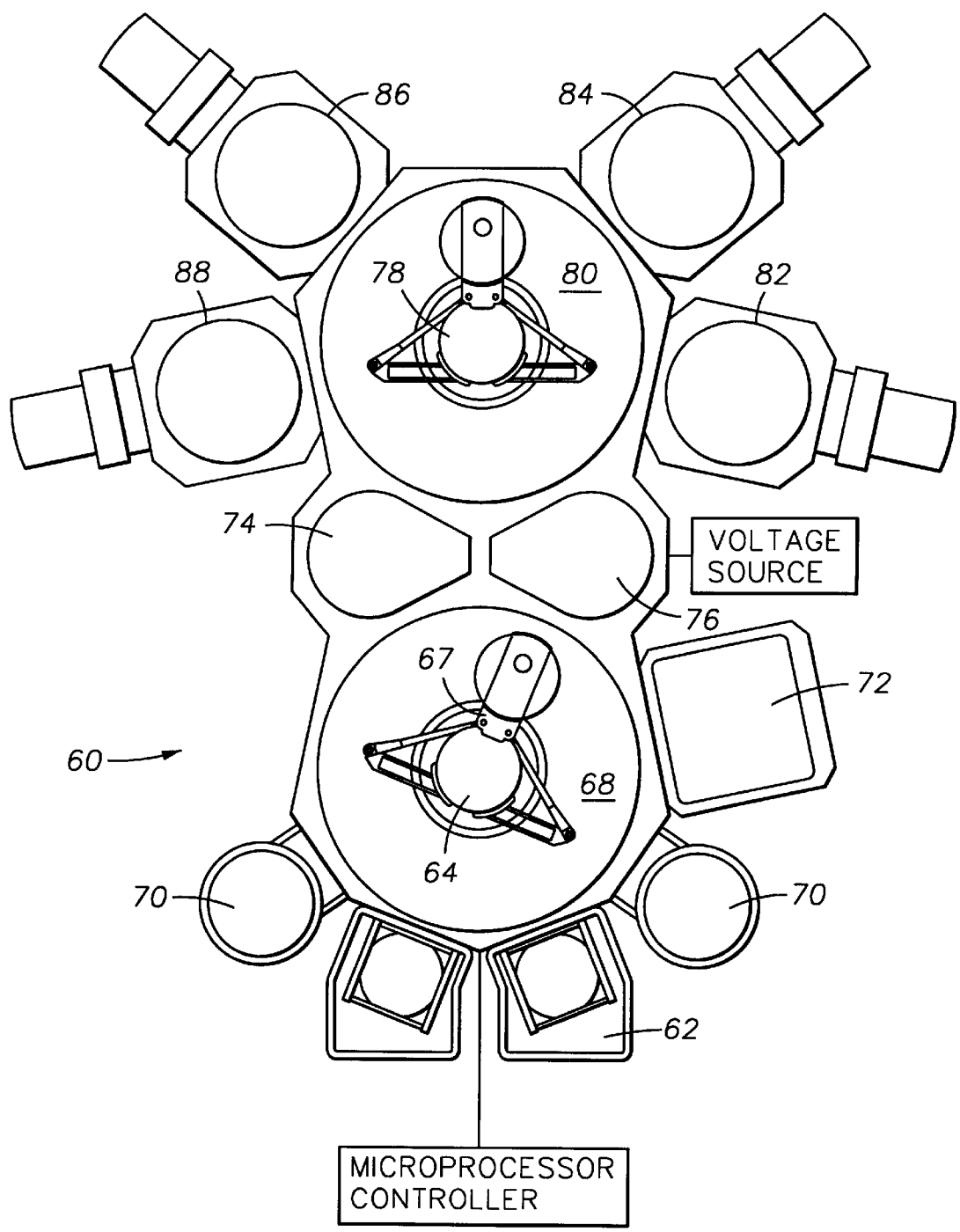
FIG. 3 is an integrated processing system configured for sequential metallization in accordance with the present invention.

The methods of the present invention are preferably carried out in an integrated cluster tool that has been programmed to process a substrate accordingly. Referring to FIG. 3, a schematic diagram of an exemplary integrated cluster tool 60 is shown. A complete description of the cluster tools and its general operation are set out in commonly assigned U.S. patent application Ser. No. 08/571,605, which is hereby incorporated by reference. The exact arrangement and combination of chambers may be altered for purposes of performing specific steps of a fabrication process.

In accordance with the present invention, the cluster tool 60 is preferably equipped with a microprocessor controller programmed to carry out the processing methods described above. In order to begin the process, a substrate must be introduced through a cassette loadlock 62. A robot 64 having a blade 67 transfers the substrate from the cassette loadlock 62 through the buffer chamber 68 to a degas wafer orientation chamber 70 and then to the preclean chamber 72.

The etched substrate is then taken by the robot into the selective CVD Al chamber 82 for void-free filling of the via to form a plug. Because certain nodules may be formed over the wire definition, it may be desirable to transfer the substrate to a warm PVD Al chamber 84 where deposition of warm aluminum planarizes the nodules.

The substrate is then transferred to chamber 86 to deposit a barrier layer over the plug and wire definition, preferably by physical vapor deposition. Copper is then deposited to fill the wire definition by physical vapor deposition. It is anticipated that the substrate may be processed or cooled in one or more chambers any number of times in any order to accomplish fabrication of the desired structure on the substrate. The substrate is then passed back through the transfer chamber 80, cooldown chamber 76 and buffer chamber 68 to the loadlock 62 so that the substrate can be removed. In order to complete the wire formation, the substrate is then sent to a chemical mechanical polishing apparatus (not shown) for planarization.

One staged-vacuum wafer processing system is disclosed in U.S. Pat. No. 5,186,718, entitled "Staged-Vacuum Wafer Processing System and Method," Tepman et al., issued on Feb. 16, 1993, which is hereby incorporated herein by reference.

While the foregoing is directed to the preferred embodiment of the present invention, other and further embodiments of the invention may be devised without departing from the basic scope thereof. The scope of the invention is determined by the claims which follow.

What is claimed is:

1. A method of forming a dual damascene interconnect in a dielectric layer having a dual damascene definition exposing a deposition enhancing material, comprising:
    a) selectively chemical vapor depositing aluminum on the deposition enhancing material to form a plug in the dual damascene definition;
    b) physical vapor depositing a layer of aluminum over exposed surfaces of the plug and the dual damascene definition;
    c) depositing a barrier layer over the layer of aluminum;
    d) depositing a conductive metal over the barrier layer to fill the dual damascene definition; and
    e) planarizing the filled dual damascene definition.

2. The method of claim 1, wherein the conductive metal is copper.

3. The method of claim 1, wherein the conductive metal is selected from the group consisting of cooper, aluminun, and combinations thereof.

4. The method of claim 1, wherein (a) through (d) are performed in an integrated processing system.

5. The method of claim 1, wherein the barrier layer comprises a material selected from the group consisting of titanium, titanium nitride, tantalum, tantalum nitride, doped silicon, aluminum, aluminum oxides, and combinations thereof.

6. A method of forming a dual damascene interconnect comprising:
    a) forming a dielectric layer over a deposition enhancing material;
    b) etching the dielectric layer to form a dual damascene definition exposing the deposition enhancing material;
    c) selectively chemical vapor depositing aluminum on the deposition enhancing material to form a plug;
    d) physical vapor depositing a layer of aluminum over the exposed surfaces of the plug and the dual damascene definition;
    e) depositing a barrier layer over the layer of aluminum;
    f) physical vapor depositing copper over the barrier layer to fill the dual damascene definition; and
    g) planarizing the filled dual damascene definition.

7. The method of claim 6, wherein (c) through (f) are performed in an integrated processing system.

8. The method of claim 6, wherein the barrier layer comprises a metal selected from the group consisting of titanium, titanium nitride, tantalum, tantalum nitride, doped silicon, aluminum, aluminum oxides, and combinations thereof.

9. The method of claim 6, wherein the deposition enhancing material is provided by a barrier layer of a metal selected from the group consisting of titanium, titanium nitride, tantalum, tantalum nitride, doped silicon, aluminum, aluminum oxides, and combinations thereof.

10. A method of forming a multilevel metal interconnect, comprising:
   a) providing a layer of a deposition enhancing material on a workpiece;
   b) forming a dielectric layer over the exposed layer of deposition enhancing material;
   c) etching the dielectric layer to form a dual damascene definition exposing the deposition enhancing material;
   d) selectively chemical vapor depositing aluminum on the deposition enhancing material to form a plug;
   e) physical vapor depositing a layer of aluminum over the exposed surfaces of the plug and the dual damascene definition;
   f) depositing a first barrier layer over the layer of aluminum;
   g) physical vapor depositing copper over the barrier layer to fill the dual damascene definition;
   h) planarizing the filled dual damascene definition;
   i) depositing a second barrier layer over the planarized dual damascene definition, wherein the second barrier layer is a deposition enhancing material; and
   j) repeating (b) through (h).

11. The method of claim 10, further comprising applying a passivating layer over the top planarized layer.

12. A method of forming a multilevel metal interconnect, comprising:
   a) providing a layer of a deposition enhancing material on a workpiece;
   b) forming a dielectric layer over the deposition enhancing material;
   c) etching the dielectric layer to form a dual damascene definition exposing the deposition enhancing material;
   d) selectively chemical vapor depositing a first conductive material on the deposition enhancing material;
   e) physical vapor depositing a second conductive material over exposed surfaces of the first conductive metal and the dual damascene definition;
   f) depositing a first barrier layer over the second conductive material;
   g) physical vapor depositing a third conductive material over the barrier layer to fill the dual damascene definition;
   h) planarizing the filled dual damascene definition;
   i) depositing a second barrier layer over the filled dual damascene definition, wherein the second barrier layer is a deposition enhancing material; and
   j) repeating (b) through (h).

13. A method of forming a dual damascene interconnect in a dielectric layer having a dual damascene definition exposing a deposition enhancing material, comprising:
   a) selectively chemical vapor depositing a first conductive metal on the deposition enhancing material;
   b) physical vapor depositing a second conductive metal over exposed surfaces of the first conductive metal and the dual damascene definition;
   c) depositing a barrier layer over the second conductive metal;
   d) physical vapor depositing a third conductive metal over the barrier layer to fill the dual damascene definition; and
   e) planarizing the filled dual damascene definition.

14. The method of claim 13, wherein the third conductive metal comprises copper.

15. The method of claim 13, wherein the third conductive metal is selected from the group consisting of copper, aluminum, and combinations thereof.

16. The method of claim 13, wherein the first and second conductive metals comprise aluminum.

17. The method of claim 13, wherein (a) through (d) are performed in an integrated processing system.

18. The method of claim 13, wherein the planarizing is performed by chemical mechanical polishing.

19. The method of claim 13, wherein the barrier layer comprises a material selected from the group consisting of titanium, titanium nitride, tantalum, tantalum nitride, doped silicon, aluminum, aluminum oxides, and combinations thereof.

20. A method of forming a dual damascene interconnect over a deposition enhancing material, comprising:
   a) forming a dielectric layer over the deposition enhancing material;
   b) etching the dielectric layer to form a dual damascene definition exposing the deposition enhancing material;
   c) selectively chemical vapor depositing a first conductive material on the deposition enhancing material to form a plug in the dual damascene definition;
   d) physical vapor depositing a second conductive material over exposed surfaces of the plug and the dual damascene definition;
   e) depositing a barrier layer over the second conductive material;
   f) physical vapor depositing a third conductive material over the barrier layer to fill the dual damascene definition; and
   g) planarizing the filled dual damascene definition.

21. The method of claim 20, wherein (c) through (f) are performed in an integrated processing system.

22. The method of claim 20, wherein the planarizing is performed by chemical mechanical polishing.

23. The method of claim 20, wherein the barrier layer comprises a material selected from the group consisting of titanium, titanium nitride, tantalum, tantalum nitride, doped silicon, aluminum, aluminum oxides, and combinations thereof.

24. The method of claim 20, wherein the first and second conductive materials are aluminum, and the third conductive material is selected from the group consisting of copper, aluminum, and combinations thereof.

25. The method of claim 20, wherein the deposition enhancing material is provided by a barrier layer of a material selected from the group consisting of titanium, titanium nitride, tantalum, tantalum nitride, doped silicon, aluminum, aluminum oxides, and combinations thereof.

* * * * *